(12) United States Patent
Su

(10) Patent No.: US 6,711,796 B2
(45) Date of Patent: Mar. 30, 2004

(54) CIRCUIT BOARD STRIPPER

(75) Inventor: Ching-Hai Su, Hou-Lung Chen (TW)

(73) Assignee: Anderson Industrial Corp., Taipei (TW)

( * ) Notice: Subject to any disclaimer, the term of this patent is extended or adjusted under 35 U.S.C. 154(b) by 370 days.

(21) Appl. No.: 09/976,193

(22) Filed: Oct. 11, 2001

(65) Prior Publication Data

US 2003/0070285 A1 Apr. 17, 2003

(51) Int. Cl.$^7$ ............................................. B25B 27/14
(52) U.S. Cl. ...................... 29/281.1; 269/55; 269/903; 269/289 R
(58) Field of Search ................. 29/281.1, 762; 269/55, 900, 903, 289 R

(56) References Cited

U.S. PATENT DOCUMENTS

| | | | | |
|---|---|---|---|---|
| 3,942,780 A | * | 3/1976 | Clement | ....................... 269/47 |
| 5,218,753 A | * | 6/1993 | Suzuki et al. | .................. 29/740 |
| 5,788,225 A | * | 8/1998 | Iwata et al. | .................. 269/309 |
| 5,810,342 A | * | 9/1998 | Kitamura et al. | ............. 269/60 |
| 5,941,700 A | * | 8/1999 | Fuchs | .......................... 432/258 |
| 6,219,897 B1 | * | 4/2001 | Inutsuka et al. | ........... 29/281.1 |

* cited by examiner

*Primary Examiner*—Lee D. Wilson
(74) *Attorney, Agent, or Firm*—Dellett & Walters

(57) ABSTRACT

A circuit board stripper includes a deck having a top pattern plate for supporting circuit boards. The deck defines a plurality of first through-holes and the pattern plate defines a plurality of second through-holes aligned with the first through-holes. A slider is movable under the deck, and has a top face formed with a plurality of slopes under the aligned through-holes of the deck and the pattern plate. A plurality of lifting pins extend upward through the aligned through-holes, and are each formed with a bottom wheel adapted to roll on corresponding one of the slopes of the deck so that the lifting pins are lifted up when the slider is moved in a first direction and are lowered down when the slider is moved in an opposite second direction. Additionally, there is a pneumatic cylinder having a ram for moving the slider in the directions.

6 Claims, 8 Drawing Sheets

CIRCUIT BOARD STRIPPER

BACKGROUND OF THE INVENTION

1. Field of the Invention

The present invention relates to a circuit board stripper and, more particularly, to a circuit board stripper which improves productivity and precision in manufacturing circuit boards.

2. Description of Related Art

Circuit boards are now widely used in industries and our daily life, for example, in computers, televisions, mobile phones and the like. These boards are made in a machine which has a stripper used to help the removal of the boards from the machine as soon as they are manufactured.

FIG. 7 shows several known strippers supported side by side on a carrier (60), with each stripper having a deck (61) and a top pattern plate (62) atop the deck (61). As clearly shown in FIG. 8, the pattern plate (62) is formed with a plurality of erected posts (70) implanted in the plate (62) in its bores (63).

A pile of circuits boards (71) is intended to be placed on the plate (62) and to be retained thereon with the posts (70) extending through orifices (72) of the boards (71). After having been manufactured, however, the circuit boards (71) must be stripped or separated from the pattern plate (62), by means of a sharp hand tool which is applied to the interface of the pattern plate (62) and the bottom one of the boards (71).

The application of the hand tool (80) brings about a problem that the boards (71) may be scarred or even buckled by the tool (80).

A more serious problem is that it takes a long time to strip or separate the circuit boards (71) from the pattern plate (62), which means the manual way results in an unsatisfactory productivity in making the boards (71).

A further problem is the inferior precision of the circuit boards (71) made, due to the fact that the hand tool (80) will make the boards (71) to be stripped obliquely, i.e. with one side high and the opposed side low. For the oblique stripping, a sufficiently tight fitting between the posts (70) of the pattern plate (62) and the orifices (72) of the circuit boards (71) is impossible. Thus the boards (71) may be slightly moved on the plate (62) during their manufacture, and the possible movement surely brings a negative affect to the precision of the boards (71) made.

Therefore, it is an objective of the invention to provide a circuit board stripper to mitigate and/or obviate the aforementioned problems.

SUMMARY OF THE INVENTION

The object of the present invention is to provide a circuit board stripper which improves productivity in manufacture circuit board.

Another object of the present invention is to provide a circuit board stripper which improve precision in manufacturing circuit board.

Other objects, advantages and novel features of the invention will become more apparent from the following detailed description when taken in conjunction with the accompanying drawings.

DETAILED DESCRIPTION OF THE PREFERRED EMBODIMENT

Figure 1:
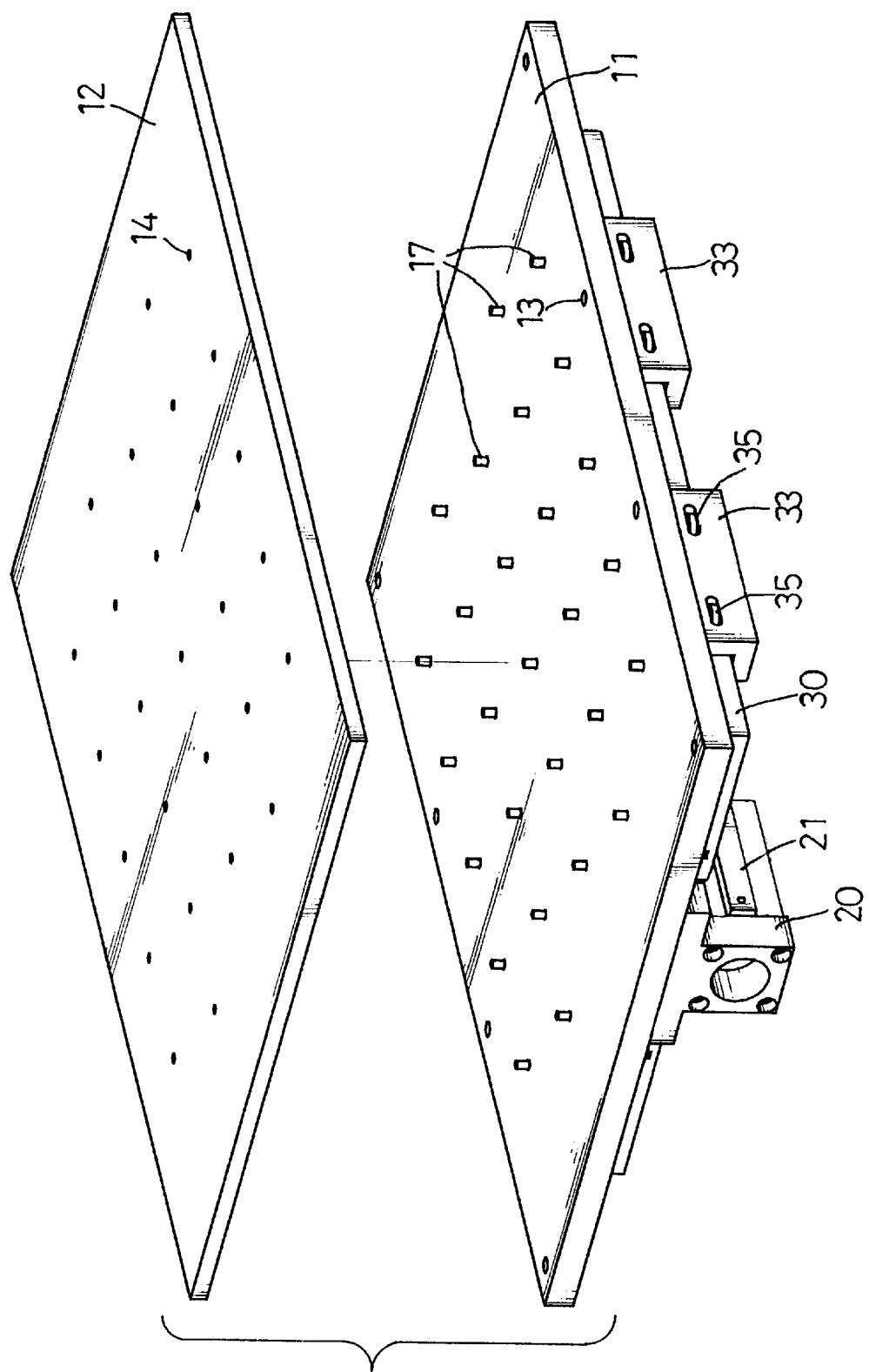
FIG. 1 is a perspective view of a preferred embodiment of a circuit board stripper in accordance with the present invention.

Referring to FIG. 1, a circuit board stripper in accordance with the present invention includes a deck (11) having a top pattern plate (12). The deck (11) defines a plurality of first through-holes (13), preferably in a regular arrangement, while the pattern plate (12) defines a plurality of second through-holes (14) which are aligned with the first through-holes (13), respectively.

Figure 3:
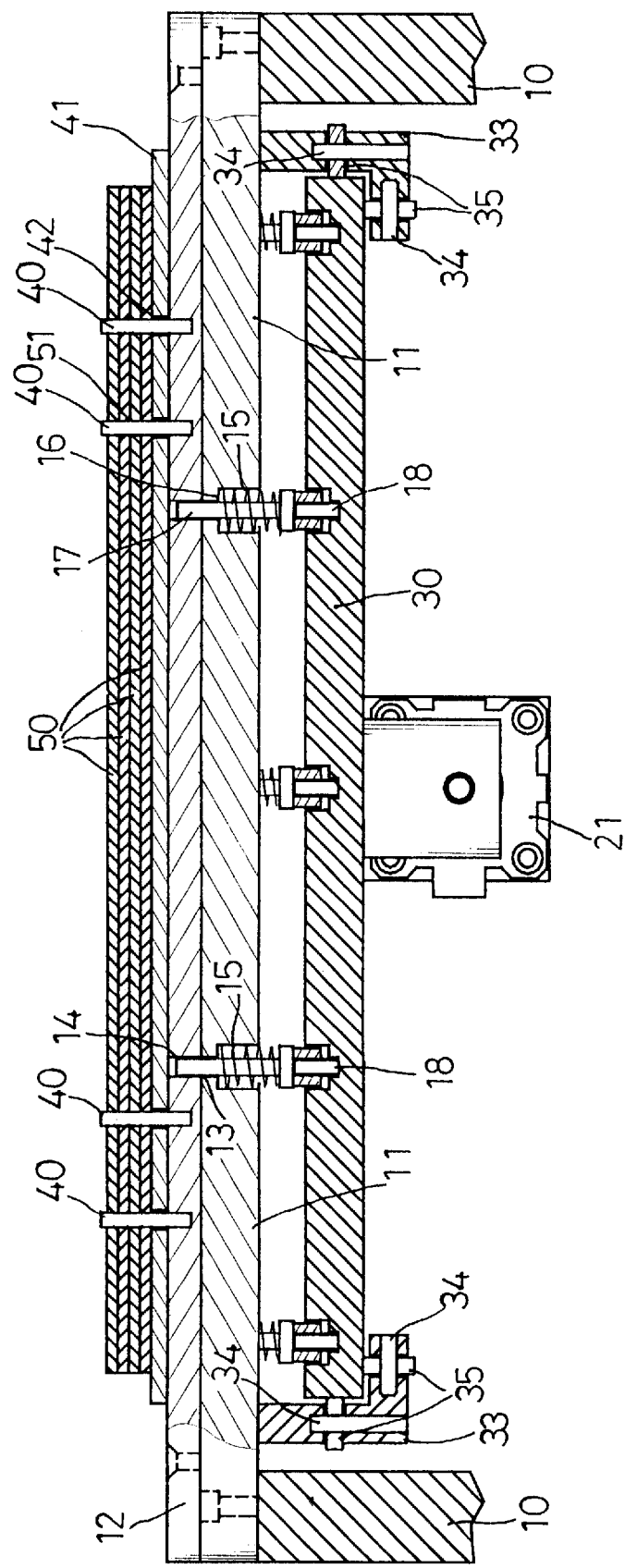
FIG. 3 is a cross-sectional side view of the circuit board stripper of FIG. 1, also showing the lifting pins in their lowered positions.

Referring to FIG. 3, the pattern plate (12) is provided for supporting a pad (41) that, in turn, supports a pile of circuit boards (50). The pattern plate (12) further has a plurality of erected posts (40), which may extend through apertures (42) of the pad (41) and orifices (51) of the circuit boards (50), thereby retaining the whole combination of the boards (50) and the pad (41) on the pattern plate (12).

Formed beneath sides of the deck (11) is a pair of opposed L-shaped guides (33) for guiding and supporting a slider (30) which is movable under the deck (11). In a highly preferred embodiment, the guides (33) are each formed with rows of rollers (35), rotatable about either horizontal or vertical axles (34), to provide smooth movement of the slide (30) with respect to the guides (33).

Figure 2:
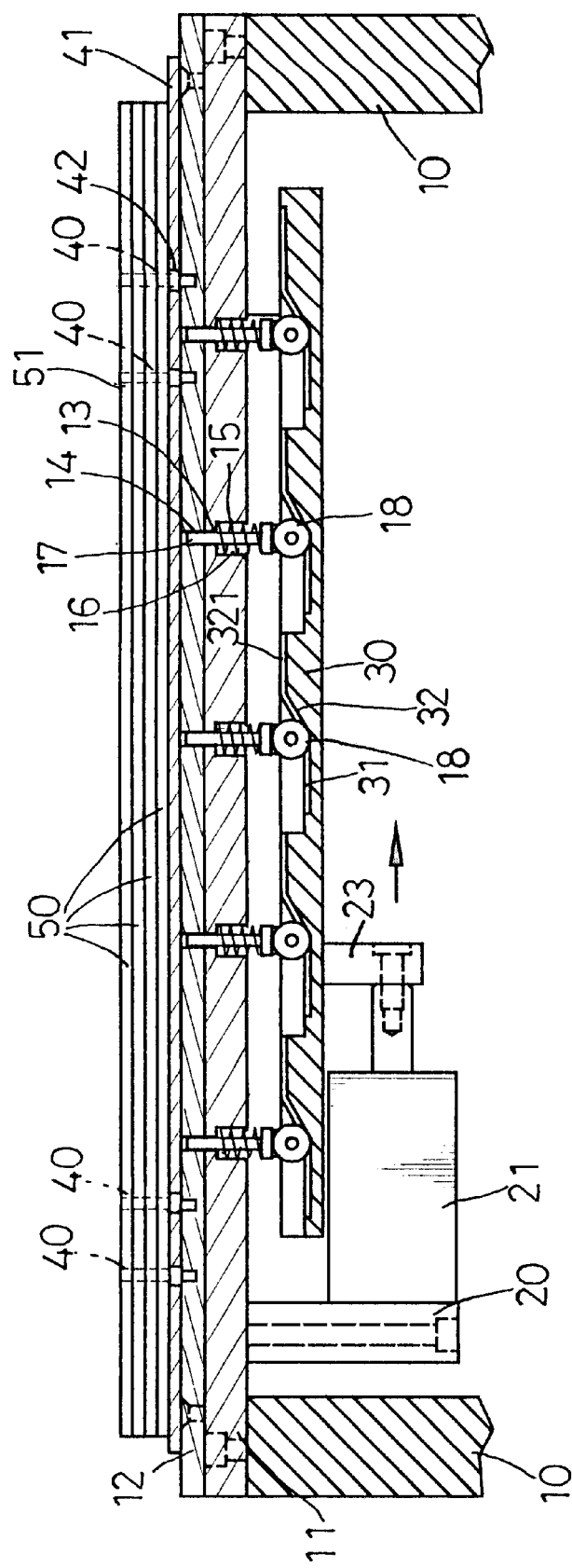
FIG. 2 is cross-sectional front view of the circuit board stripper of FIG. 1, showing a plurality of lifting pins in their lowered positions.

Referring to FIG. 2, the slider (30) has a top face formed with a plurality of slopes, each including a chute (32) interconnecting a lowland (31) and a highland (321). The slopes are located under aligned through-holes (13,14) of the deck (11) and the plate (14).

A plurality of lifting pins (17) extend upward through the aligned through-holes (13,14), and are formed with respective bottom wheels (18) adapted to roll on the slopes of the slider (30).

Figure 5:
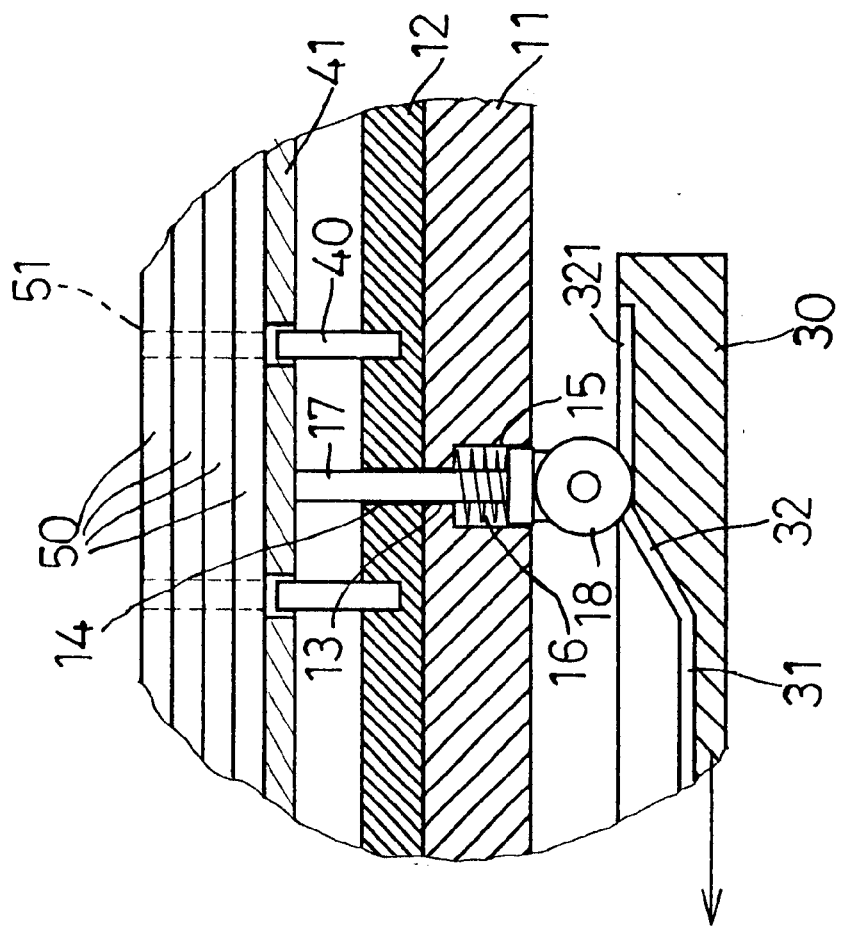
FIG. 5 is a fragmentary enlarged view taken from FIG. 4.

Each of the bottom wheels (18) may be kept in contact with the slopes i.e. the chute (32), lowland (31) and highland (321), such as by a compressed spring (16) that is mounted around the pin (17) and is received in an enlarged lower portion (15) of the first through-hole (13) of the deck (11), as best shown in FIG. 5.

Figure 4:
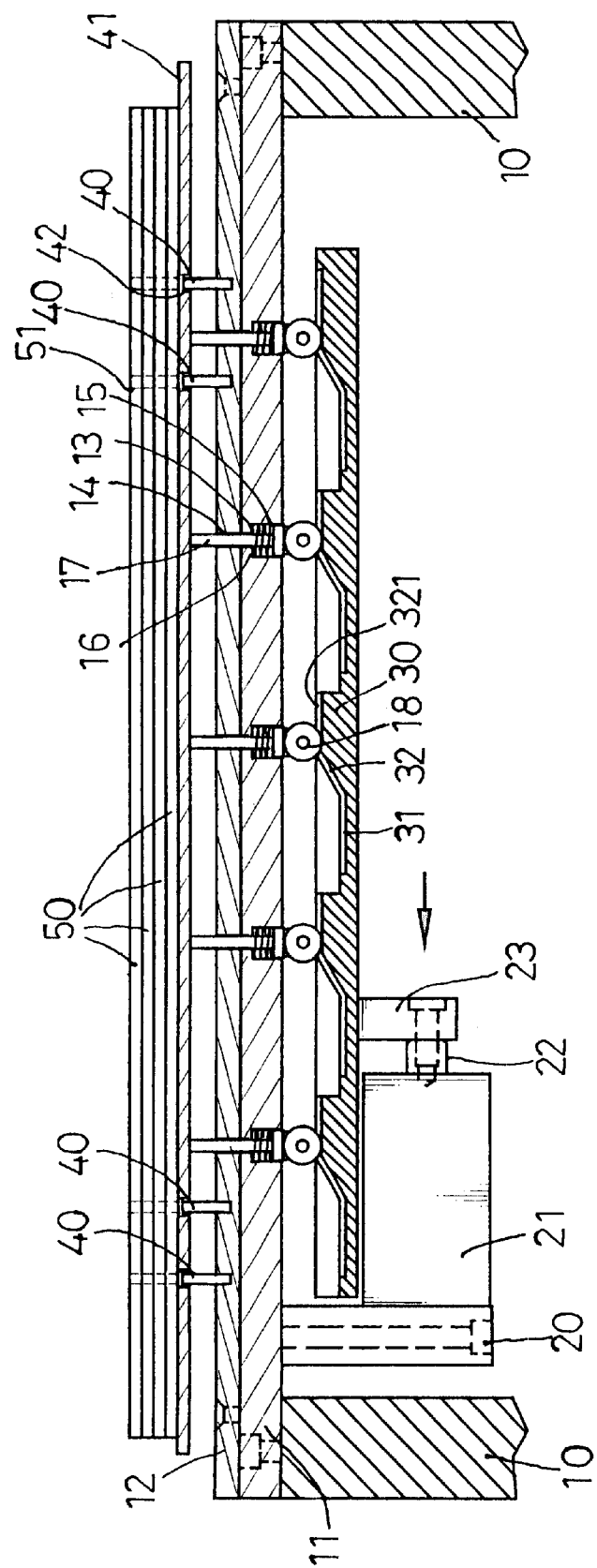
FIG. 4 is cross-sectional front view of the circuit board stripper of FIG. 1, showing the plurality of lifting pins in their lifted positions.

Referring to FIGS. 4 and 5, the deck (11) further has a downwardly extending holder (20) that supports a pneumatic cylinder (21). The cylinder (21) has a ram (22) connected with the slider (30) via a connector (23), so as to move the slider (30) in a first direction and an opposite second direction.

In this configuration, the circuit boards (50) can be lifted up away from inventive stripper by moving the slider (30) in a leftward direction, as designated by the arrow in FIG. 4, i.e. by retracting the ram (22) of the pneumatic cylinder (21).

The movement of the slider (30) in this direction causes the rollers (18) to roll on its top face from the lowlands (31) to the highlands (321) through the chutes (32), thereby lifting up all the pins (17), which are then moved along the aligned holes (13,14), abutting and lifting or elevating the pads (41), together with the pile of circuit boards (50), uniformly away from the pattern plate (12). The circuit boards (50) are then ready to be removed from the stripper, as best shown in FIG. 5.

While the ram (22) of the pneumatic cylinder (20) is extended, the slider (30) is moved in a rightward direction, as designated by the arrow in FIG. 2. This movement of the slider (30) causes the rollers (18) to roll on its top face again, but from the highlands (321) to the lowlands (31) under the action of the compressed springs (16). Thus the lifting pins (17) are lowered back to their original positions, as shown in FIGS. 2 and 3.

Figure 6:
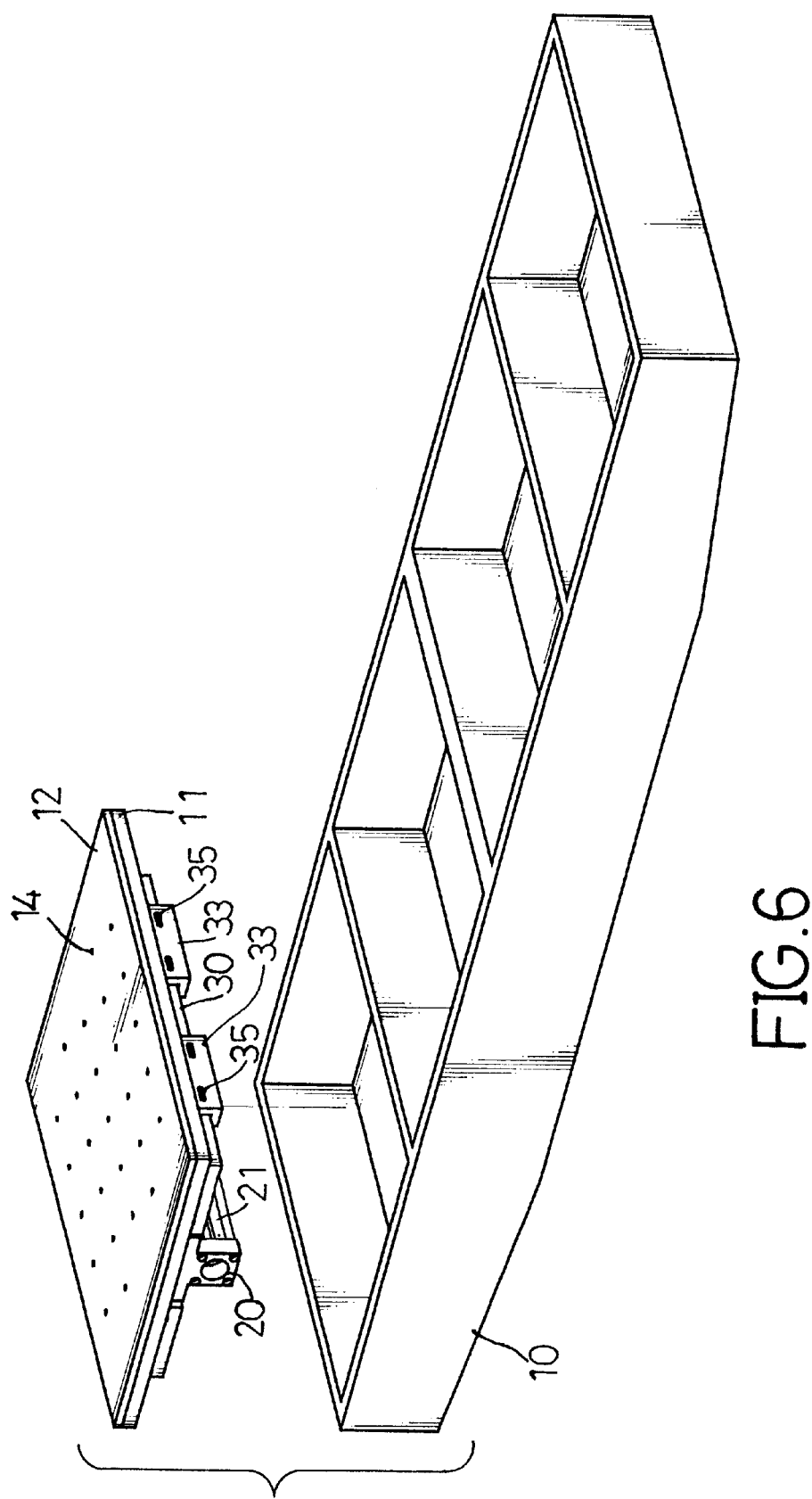
FIG. 6 is a perspective view of the circuit board stripper of FIG. 1, showing the stripper supported on a carrier.
Figure 7:
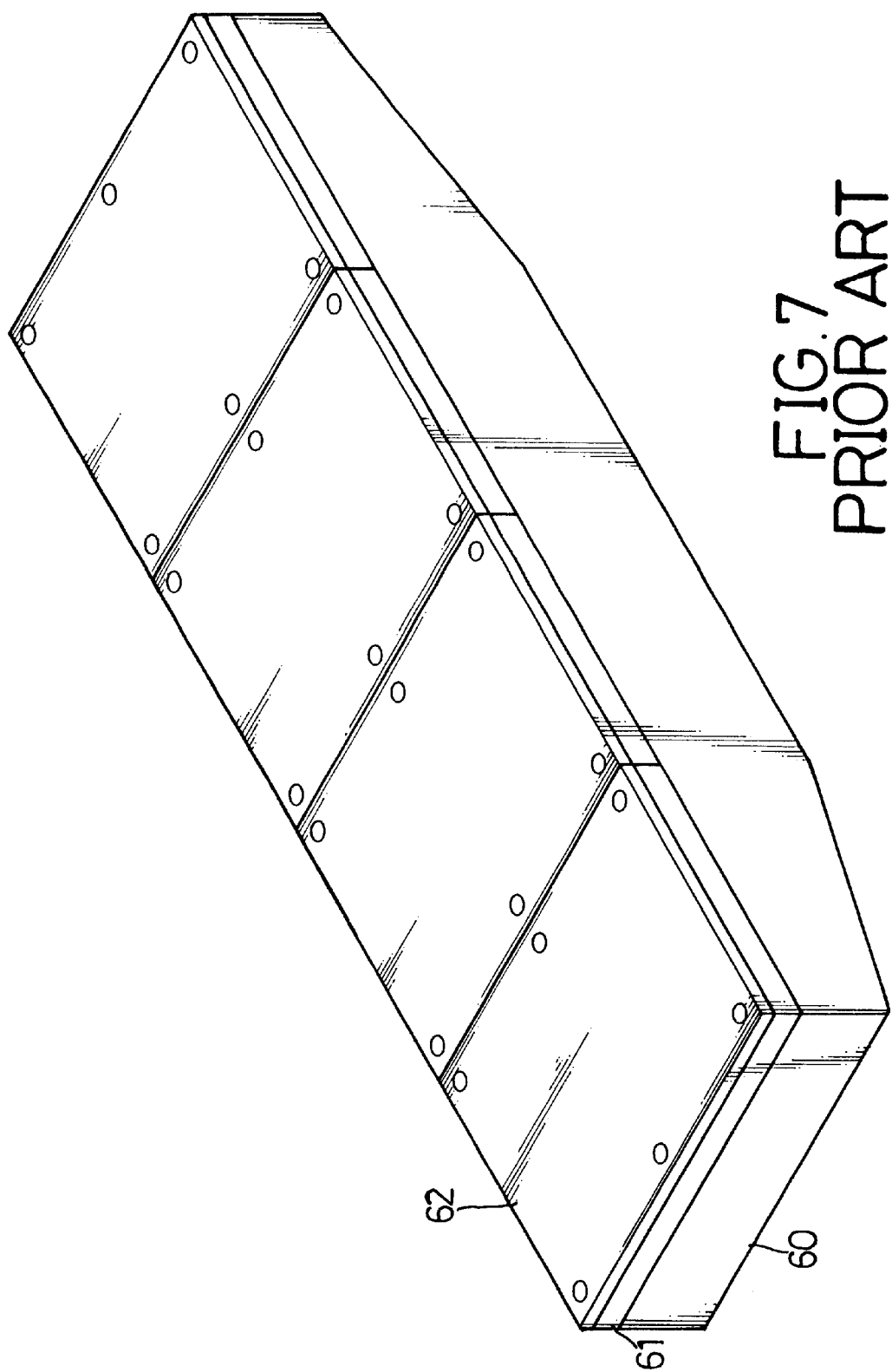
FIG. 7 is a perspective view of circuit board strippers of a conventional type.
Figure 8:
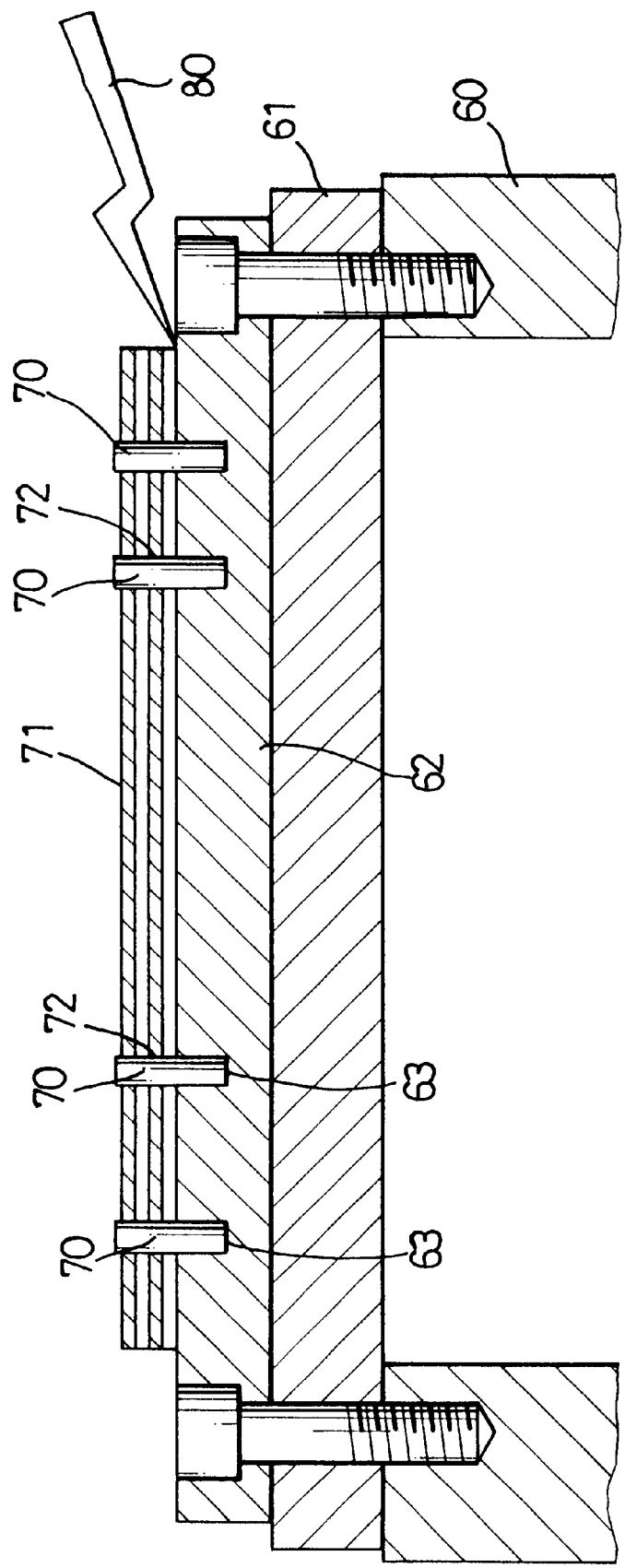
FIG. 8 is a cross-sectional view of one of the circuit board strippers shown in FIG. 7.

Referring to FIG. 6, the inventive stripper, together with others of the same type, may be placed sequentially on a common carrier (10) with its deck (11) across the width of the carrier (10), as in the case of the prior art.

From the above description, it is noted that the invention has the following advantages:

1. improving the productivity in manufacturing the circuit boards (50):

Because the circuit boards (50) are stripped mechanically rather than manually, the stripping process can be completed much more quickly and so the productivity is improved.

2. improving the precision in manufacturing the circuit boards (50):

Because the circuit boards (50) are lifted or elevated uniformly, the diameters of either the orifices (51) of the circuit boards (50) or of the erected posts (40) of the pattern plate (12) can be selected so that the posts (40) may fit the orifices (51) snugly, in order to ensure the precision with which the circuit boards (50) is made.

3. protecting the circuit boards (50) from being scarred or buckled:

Because the circuit boards (50) are stripped by the lifting pins (17), the boards (50) will not be scarred or buckled by the hand tool (80) which is necessary in the prior art.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A circuit board stripper comprising:
    a deck (11) having a top pattern plate (12) for supporting circuit boards (50), said deck (11) defining a plurality of first through-holes (13), said pattern plate (12) defining a plurality of second through-holes (14) aligned with said first through-holes (13) of said deck (11);
    a slider (30) movable under said deck (11), said slider (30) having a top face formed with a plurality of slopes under said aligned through-holes (13,14) of said deck (11) and said pattern plate (14);
    a plurality of lifting pins (17) extending upward through said aligned through-holes (13,14), each of said lifting pins (17) being formed with a bottom wheel (18) adapted to roll on corresponding one of said slopes of said deck (11) so that said lifting pins (17) are lifted up when said slider (30) is moved in a first direction and are lowered down when said slider (30) is moved in a second direction opposite to said first direction; and
    a pneumatic cylinder (21) having a ram (22) for moving said slider (30) in said directions.

2. The circuit board stripper as claimed in claim 1, wherein each of said slopes includes a chute (32) interconnecting a lowland (31) and a highland (321).

3. The circuit board stripper as claimed in claim 1, wherein said deck (11) has a pair of opposed guides (33) formed beneath sides thereof for guiding and supporting said slider (30).

4. The circuit board stripper as claimed in claim 3, wherein each of said guides (33) is formed with rollers (35) to provide smooth movement of said slide (30) with respect to said guides (33).

5. The circuit board stripper as claimed in claim 3, wherein said guides (33) are configured into opposed L-shaped configuration.

6. The circuit board stripper as claimed in claim 1, wherein each of said first through-holes (13) of said deck (11) has an enlarged lower portion (15), and wherein a spring (16) is received in said enlarged lower portion (15) and mounted around one of said lifting pins (17) to keep said roller (18) in contact with said slope.

* * * * *